US010117353B2

(12) United States Patent
Burns et al.

(10) Patent No.: US 10,117,353 B2
(45) Date of Patent: Oct. 30, 2018

(54) STAND

(71) Applicant: VANTAGE POINT PRODUCTS CORP., Santa Fe Springs, CA (US)

(72) Inventors: Don Burns, Santa Fe Springs, CA (US); Glenn Hamilton, Santa Fe Springs, CA (US)

(73) Assignee: VANTAGE POINT PRODUCTS CORP., Santa Fe Springs, CA (US)

( * ) Notice: Subject to any disclaimer, the term of this patent is extended or adjusted under 35 U.S.C. 154(b) by 0 days.

(21) Appl. No.: 15/603,113

(22) Filed: May 23, 2017

(65) Prior Publication Data

US 2017/0339800 A1 Nov. 23, 2017

Related U.S. Application Data

(60) Provisional application No. 62/340,435, filed on May 23, 2016, provisional application No. 62/348,368, filed on Jun. 10, 2016.

(51) Int. Cl.
*G06F 1/16* (2006.01)
*H05K 7/18* (2006.01)
(Continued)

(52) U.S. Cl.
CPC ........... *H05K 7/183* (2013.01); *F16M 11/041* (2013.01); *F16M 11/10* (2013.01); *F16M 11/22* (2013.01); *F16M 13/02* (2013.01); *G06F 1/1622* (2013.01); *G06F 1/1654* (2013.01); *G07G 1/0018* (2013.01); *F16M 2200/02* (2013.01); *F16M 2200/028* (2013.01); *F16M 2200/066* (2013.01); *F16M 2200/08* (2013.01)

(58) Field of Classification Search
CPC .............................. G06F 1/1622; G06F 1/1654
USPC .......................... 361/679.04, 679.06, 679.07
See application file for complete search history.

(56) References Cited

U.S. PATENT DOCUMENTS 892,612 A * 7/1908 O'Neill .................. F16M 13/02
248/279.1
4,638,969 A * 1/1987 Brown ............... F16M 11/2014
248/122.1
(Continued)

FOREIGN PATENT DOCUMENTS

EP         2775192 A2     9/2014
WO    WO 03/092341 A2    11/2003

OTHER PUBLICATIONS

International Search Report and Written Opinion for International Application No. PCT/US2017/034050, dated Aug. 22, 2017, 13 pages.

(Continued)

*Primary Examiner* — Adrian S Wilson
(74) *Attorney, Agent, or Firm* — Lewis Roca Rothgerber Christie LLP

(57) ABSTRACT

A stand assembly including a stand having a base portion and a support portion extending from the base portion. The support portion defines at least one cable routing opening. The stand assembly also includes at least one support arm configured to be coupled to the support portion of the stand, and at least one device attachment member configured to be detachably coupled to the at least one support arm. The at least one support arm is configured to rotate relative to the support portion of the stand between a first angular position and a second angular position.

20 Claims, 8 Drawing Sheets

(51) Int. Cl.
*F16M 11/10* (2006.01)
*F16M 11/22* (2006.01)
*F16M 13/02* (2006.01)
*F16M 11/04* (2006.01)
*G07G 1/00* (2006.01)

(56) References Cited

U.S. PATENT DOCUMENTS

| | | | | |
|---|---|---|---|---|
| 5,630,566 | A * | 5/1997 | Case | A47B 23/046 248/122.1 |
| 5,687,939 | A * | 11/1997 | Moscovitch | F16M 11/14 248/122.1 |
| 5,982,429 | A * | 11/1999 | Kamamoto | H04N 5/23293 348/333.06 |
| 6,189,842 | B1 * | 2/2001 | Bergeron Gull | F16M 11/105 248/125.1 |
| 6,343,006 | B1 * | 1/2002 | Moscovitch | B60R 11/02 348/794 |
| 6,409,134 | B1 * | 6/2002 | Oddsen, Jr. | F16M 11/10 248/274.1 |
| 6,844,865 | B2 * | 1/2005 | Stasko | F16M 11/048 345/1.3 |
| 6,961,237 | B2 * | 11/2005 | Dickie | G06F 1/1616 345/158 |
| 7,046,286 | B1 * | 5/2006 | Kobayashi | H04N 5/23216 348/333.06 |
| 7,084,919 | B2 * | 8/2006 | Shibata | H04M 1/021 348/333.06 |
| D549,232 | S | 8/2007 | Li et al. | |
| 7,315,291 | B2 * | 1/2008 | Yoshihara | B60R 11/0235 345/1.1 |
| 7,502,561 | B2 * | 3/2009 | Lee | H04N 5/2251 348/333.06 |
| 7,529,083 | B2 * | 5/2009 | Jeong | F16M 11/105 248/917 |
| 7,623,342 | B2 * | 11/2009 | Ozolins | F16M 11/105 16/361 |
| 7,644,898 | B2 * | 1/2010 | White | A61B 90/50 211/26 |
| 7,780,124 | B2 * | 8/2010 | Wang | H04N 5/64 248/122.1 |
| 7,852,622 | B2 * | 12/2010 | Ferren | B60K 35/00 248/917 |
| D632,301 | S * | 2/2011 | Kasuga | D14/452 |
| 7,975,350 | B2 * | 7/2011 | Nagami | B60R 11/0235 16/334 |
| 8,000,090 | B2 * | 8/2011 | Moscovitch | F16M 11/105 361/679.04 |
| D649,153 | S | 11/2011 | Symons | |
| 8,083,189 | B2 * | 12/2011 | Sun | F16M 11/08 248/122.1 |
| 8,102,333 | B2 * | 1/2012 | Kondo | G06F 3/1446 248/917 |
| 8,162,268 | B1 * | 4/2012 | Huang | F16M 11/08 248/124.1 |
| 8,313,072 | B2 * | 11/2012 | Bakkom | E05D 3/12 248/282.1 |
| D676,450 | S | 2/2013 | Lye | |
| D678,886 | S | 3/2013 | Heckler | |
| D703,676 | S | 4/2014 | Smith et al. | |
| D708,187 | S | 7/2014 | Xiang | |
| 8,794,579 | B2 * | 8/2014 | Sturman | F16M 11/105 248/160 |
| D746,292 | S | 12/2015 | Heckler | |
| 9,360,892 | B2 | 6/2016 | Heckler | |
| D760,723 | S | 7/2016 | Won et al. | |
| D760,724 | S | 7/2016 | Kang et al. | |
| D762,650 | S | 8/2016 | Bang et al. | |
| 9,424,721 | B2 * | 8/2016 | Edwards | E05B 65/461 |
| D772,216 | S | 11/2016 | Lau | |
| D777,166 | S | 1/2017 | Bidwell et al. | |
| 9,687,059 | B2 * | 6/2017 | Walia | B41J 3/4073 |
| 2001/0023914 | A1 * | 9/2001 | Oddsen, Jr. | F16M 11/10 248/274.1 |
| 2003/0136888 | A1 * | 7/2003 | Boele | F16M 11/041 248/280.11 |
| 2003/0154673 | A1 * | 8/2003 | MacGregor | A47B 83/001 52/239 |
| 2004/0031893 | A1 * | 2/2004 | Smed | F16M 11/10 248/278.1 |
| 2004/0035987 | A1 * | 2/2004 | Oddsen, Jr. | A47B 49/00 248/121 |
| 2004/0066614 | A1 * | 4/2004 | Hong | G06F 1/1616 361/679.55 |
| 2004/0149873 | A1 * | 8/2004 | Ishizaki | F16M 11/105 248/274.1 |
| 2004/0233623 | A1 * | 11/2004 | Hillman | F16M 11/10 361/679.06 |
| 2004/0245420 | A1 * | 12/2004 | Pfister | F16C 11/103 248/289.11 |
| 2006/0238967 | A1 * | 10/2006 | Carson | B60R 11/0235 361/679.04 |
| 2006/0279915 | A1 * | 12/2006 | Lee | H04N 5/2252 361/679.07 |
| 2006/0291151 | A1 * | 12/2006 | Chen | F16M 11/10 361/679.22 |
| 2007/0047187 | A1 * | 3/2007 | Kumano | G06F 1/1601 361/679.06 |
| 2007/0086155 | A1 * | 4/2007 | Chen | G06F 1/1616 361/679.06 |
| 2007/0177339 | A1 * | 8/2007 | Flessas | G06F 1/1601 361/679.06 |
| 2007/0252060 | A1 * | 11/2007 | McPherson | F16M 11/08 248/282.1 |
| 2008/0123265 | A1 * | 5/2008 | Ohlinger | F16M 11/10 361/679.06 |
| 2008/0158801 | A1 * | 7/2008 | Mathews | A61H 5/00 361/679.07 |
| 2008/0232044 | A1 * | 9/2008 | Moscovitch | F16M 11/041 361/679.04 |
| 2009/0201661 | A1 * | 8/2009 | Kim | F16M 11/14 361/829 |
| 2013/0020445 | A1 | 1/2013 | O'Kasick et al. | |
| 2013/0094127 | A1 | 4/2013 | Lu | |
| 2016/0070964 | A1 | 3/2016 | Conrad | |

OTHER PUBLICATIONS https://www.compulocks.com/grip-and-dock-tablet-stand-secure-tablet-hand-grip-tablet-mobile-security-solution.html, 3 pages, May 30, 2017.
https://www.compulocks.com/hovertab-security-ipad-lock-stand-best-universal-display-tablet-lock-stand.html, 2 pages, May 30, 2017.

* cited by examiner

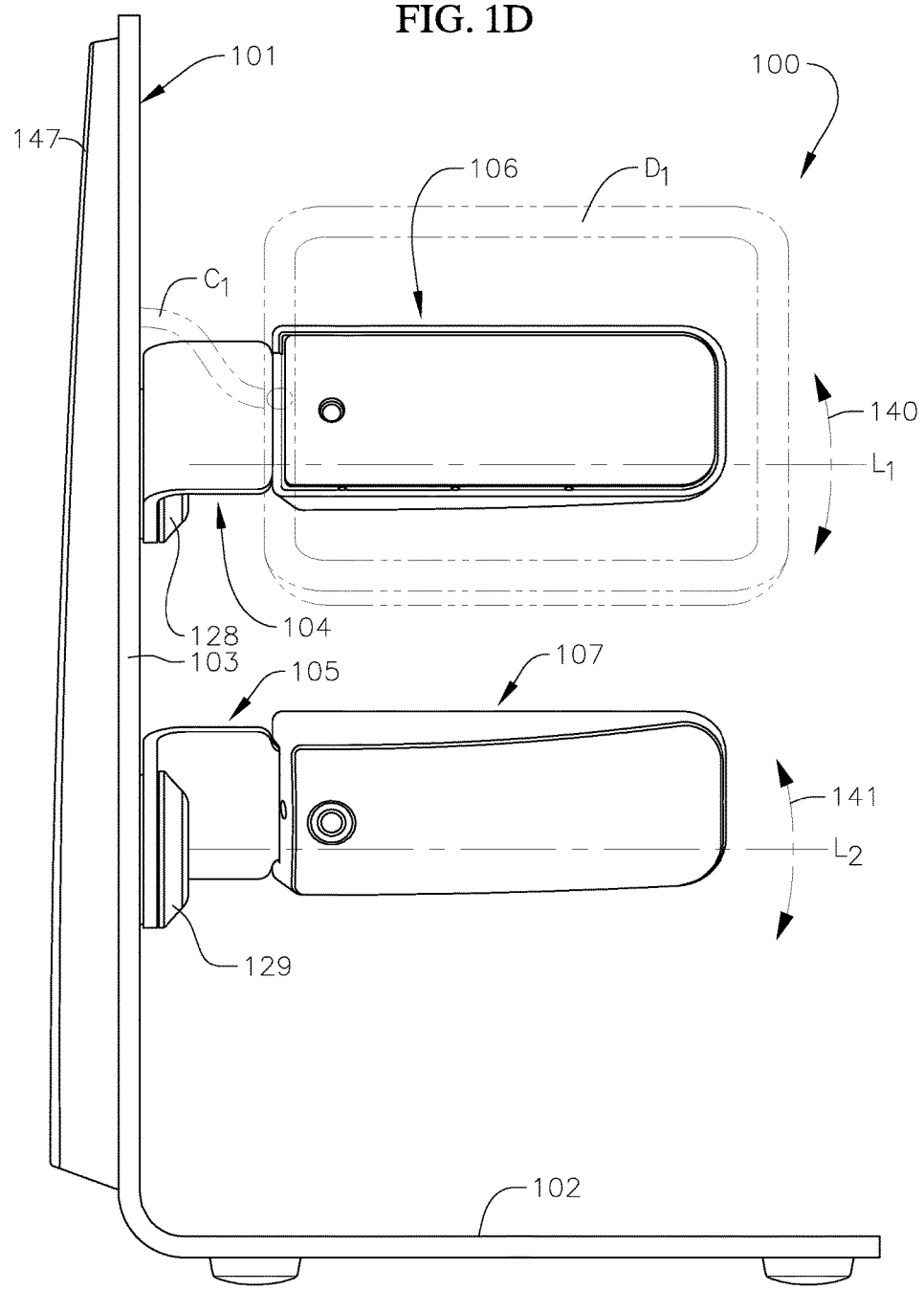

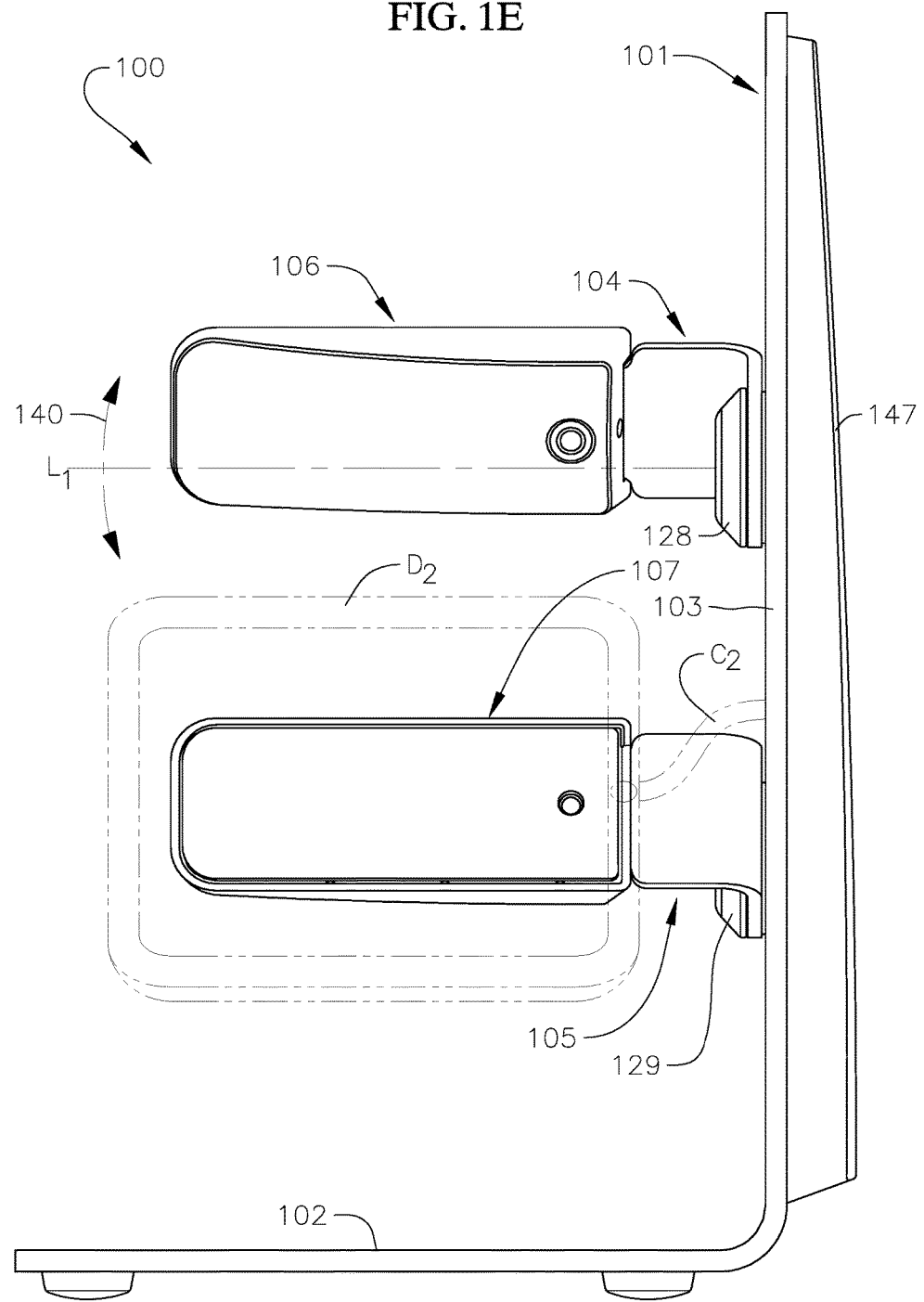

STAND

CROSS-REFERENCE TO RELATED APPLICATIONS

The present application claims priority to and the benefit of U.S. Provisional Application No. 62/340,435, filed May 23, 2016, and U.S. Provisional Application No. 62/348,368, filed Jun. 10, 2016, the entire contents of both of which are incorporated herein by reference.

FIELD

The present disclosure relates generally to stands.

BACKGROUND

Point-of-sale devices used in retail store settings commonly include a display device, such as a monitor or computer tablet, and payment processing hardware. In many conventional point-of-sale devices, the display device is either fixed in place (i.e., the orientation of the display device cannot be adjusted) or the display device is freely movable. However, conventional point-of-sale displays that are freely movable are not physically secured to another structure, and are therefore prone to loss and/or misplacement. Accordingly, such conventional point-of-sale displays are commonly carried around by an employee of the retail store, which can be cumbersome.

SUMMARY

The present disclosure is directed to various embodiments of stand assemblies. In one embodiment, the stand assembly includes a stand having a base portion and a support portion extending from the base portion. The support portion defines at least one cable routing opening. The stand assembly also includes at least one support arm configured to be coupled to the support portion of the stand and at least one device attachment member configured to be detachably coupled to the at least one support arm. The at least one support arm is configured to rotate relative to the support portion of the stand between a first angular position and a second angular position.

The at least one cable routing opening may be an arcuate opening extending about an angle corresponding to an angle between the first angular position and the second angular position.

The stand assembly may also include at least one cap configured to rotatably couple the at least one support arm to the support portion of the stand and at least one fastener configured to couple the at least one cap to the support portion of the stand. Tightening of the at least one fastener is configured to draw the at least one support arm into tighter engagement with the support portion of the stand to increase a tilt resistance of the at least one support arm, and loosening of the at least one fastener is configured to withdraw the at least one support arm into looser engagement with the support portion of the stand to reduce the tilt resistance of the at least one support arm. The at least one cap may include a circular standoff and the at least one support arm may include a circular opening configured to accommodate the circular standoff. Engagement between the circular standoff and the circular opening permits the at least one support arm to rotate relative to the at least one cap. The at least one support arm may also include a cog extending into the circular opening, and the at least one cap may also include a notch in the circular standoff configured to accommodate the cog. Engagement between the cog and an end of the notch is configured to limit the rotation of the at least one support arm. The at least one cap further may include an annular flange extending radially outward from the circular standoff that is larger than the circular opening in the at least one support arm.

The at least one support arm may include a pair of tines separated by a slot. The at least one device attachment member may define a pair of receptacle portions separated by a central rib. The pair of tines is received in the pair of receptacle portions and the rib is received in the slot when the at least one device attachment member is coupled to the at least one support arm.

The stand assembly may also include an attachment opening defined in the at least one device attachment member and an attachment opening defined in the at least one support arm. The attachment opening in the at least one support arm is aligned with the attachment opening in the at least one device attachment member when the pair of tines of the at least one support arm is received in the pair of receptacles in the at least one device attachment member. The stand assembly may also include a pin lock configured to extend through the attachment opening in the at least one device attachment member and into the attachment opening in the at least one support arm to secure the at least one device attachment member to the at least one support arm.

The stand assembly may include a cover configured to be coupled to support portion of the stand. When the cover installed, the cover conceals the at least one cable routing opening.

The at least one cable routing opening may include a first cable routing opening and a second cable routing opening, and the at least one support arm may include a first support arm configured to be coupled to the support portion of the stand proximate to the first cable routing opening and a second support arm configured to be coupled to the support portion of the stand proximate to the second cable routing opening. The at least one device attachment member may include a first device attachment member configured to be coupled to the first support arm and a second device attachment member configured to be coupled to the second support arm. When the first and second support arms are coupled to the stand and the first and second device attachment members are coupled to the first and second support arms, the first device attachment member may face in a first direction and the second device attachment member may face in a second direction different than the first direction.

The stand assembly according to one embodiment of the present disclosure includes a stand having a base portion and a support portion extending from the base portion. The support portion defines a pair of cable routing openings. The stand assembly also includes pair of first and second support arms configured to be coupled to the support portion of the stand. Each of the first and second support arms includes a pair of tines separated by a slot, a circular opening, and a cog extending into the circular opening. The stand assembly also includes a pair of first and second device attachment members configured to be detachably coupled to the pair of first and second support arms. Each of the first and second device attachment members includes a pair of receptacle portions separated by a central rib. The stand assembly also includes pair of first and second caps configured to rotatably couple the pair of first and second support arms to the support portion of the stand. Each of the first and second caps includes a circular standoff and a notch in the circular standoff. The stand assembly also includes a cover configured to be coupled to the support portion of the stand. For each support arm and corresponding cap, engagement between the circular standoff and the circular opening permits the support arm to rotate relative to the support portion of the stand between a first angular position and a second angular position. For each support arm and corresponding cap, engagement between the cog and an end of the notch limits rotation of the support arm. Each cable routing opening of the pair of cable routing openings is an arcuate opening extending about an angle corresponding to an angle between the first angular position and the second angular position. For each support arm and corresponding device attachment member, the pair of tines is received in the pair of receptacle portions and the rib is received in the slot when the pair of first and second device attachment members is coupled to the pair of first and second support arms.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and/or advantages of embodiments of the present disclosure will become more apparent by reference to the following detailed description when considered in conjunction with the following drawings. In the drawings, like reference numerals are used throughout the FIGURES to reference like features and components. The figures are not necessarily drawn to scale, nor is every feature in the drawings necessarily required to fall within the scope of the described invention.

FIGS. 1C-1H are a perspective view, a front view, a back view, a right side view, a left side view, and a top view, respectively, of the embodiment of the stand assembly illustrated in FIGS. 1A-1B.

DETAILED DESCRIPTION

Figure 1A:
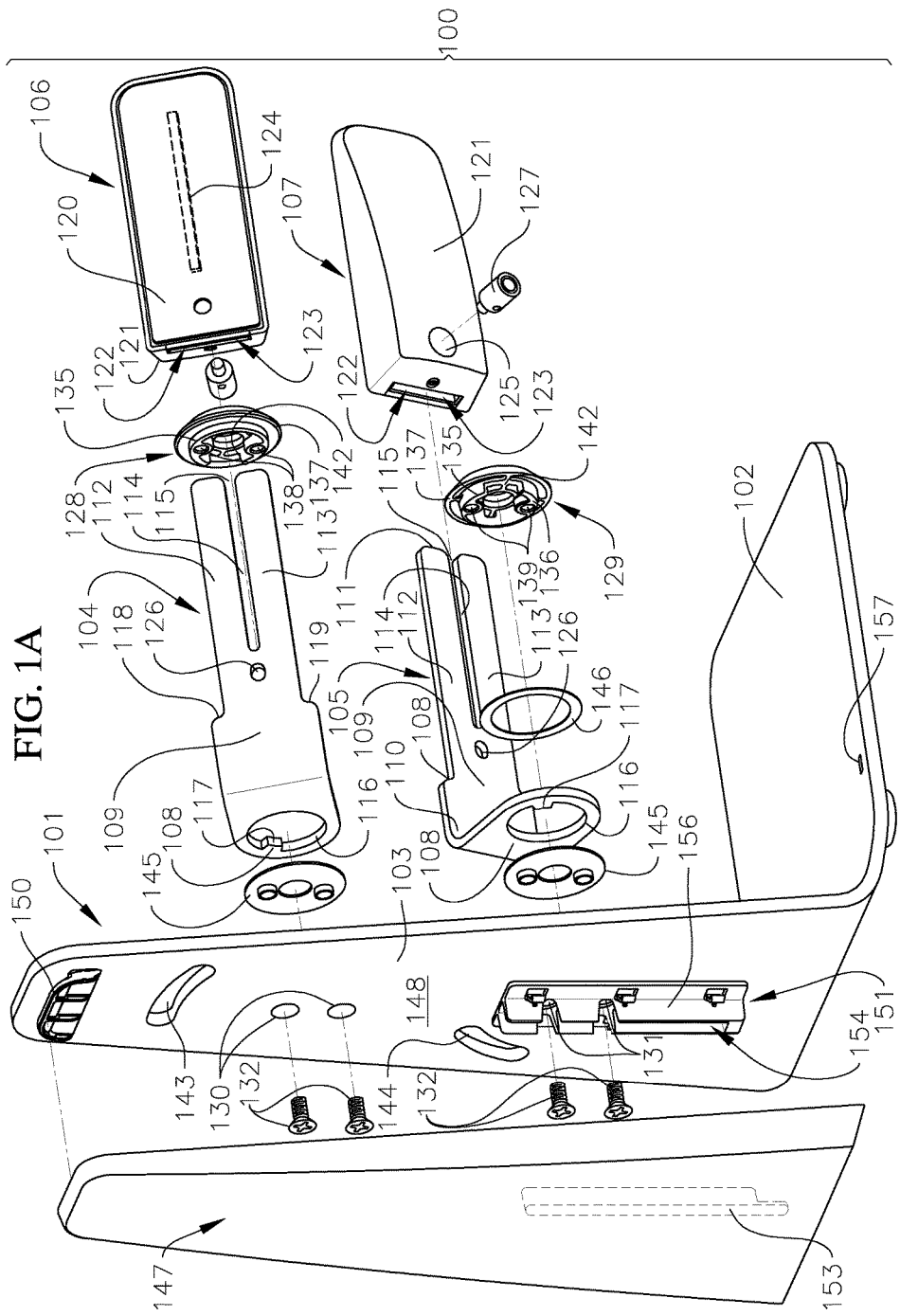
FIGS. 1A-1B are exploded perspective views of a stand assembly according to one embodiment of the present disclosure.

The present disclosure is directed to various embodiments of a stand assembly designed for holding tablet computers, cellular phones, payment processing hardware, and/or other devices typically used in point-of-sale applications, in a secure, adjustable, and removable (i.e., detachable) manner.

With reference now to FIGS. 1A-1H, a stand assembly 100 according to one embodiment of the present disclosure includes a stand 101 having a base portion 102 and a support portion 103 extending up from the base portion 102, a pair of support arms 104, 105 configured to be movably attached (e.g., rotatably or tiltably attached) to the support portion 103 of the stand 101, and a pair of device attachment members 106, 107 (i.e., device attachment brackets) configured to be detachably coupled to the support arms 104, 15, respectively. In the illustrated embodiment, the support arms 104, 105 and the device attachment members 106, 107 are positioned in a vertical orientation on the support portion 103 of the stand 101 such that the stand assembly 100 includes an upper support arm 104 and a corresponding upper device attachment member 106 configured to be detachably coupled to the upper support arm 104, and a lower support arm 105 and a corresponding lower device attachment member 107 configured to be detachably coupled to the lower support arm 105. In one or more embodiments, the support arms 104, 105 and the device attachment members 106, 107 may be arranged in any other suitable configuration on the stand 101 (e.g., the support arms 104, 105 and the device attachment members 106, 107 may be arranged side-by-side in a horizontal orientation).

Figure 1B:
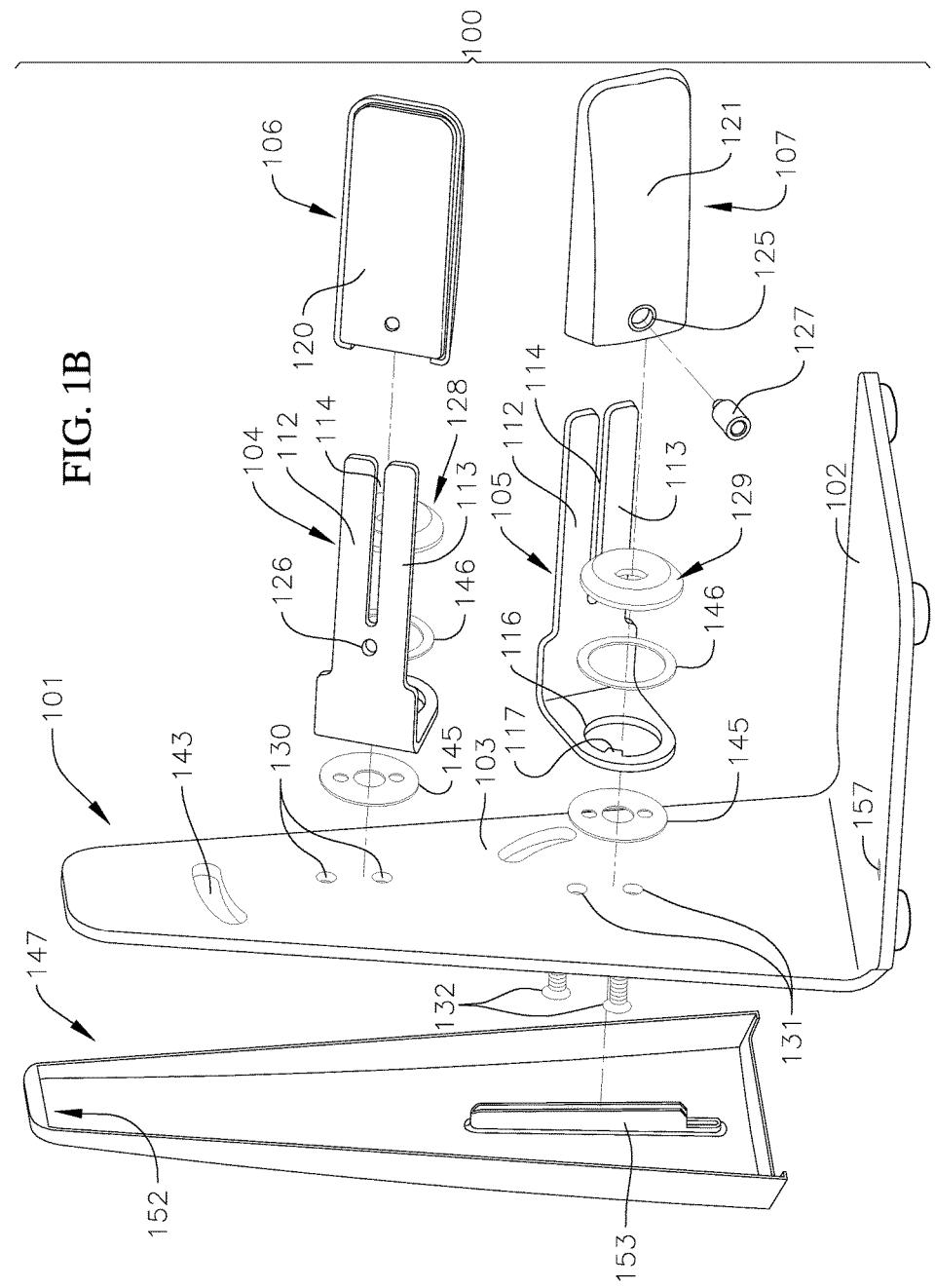
Figure 1C:
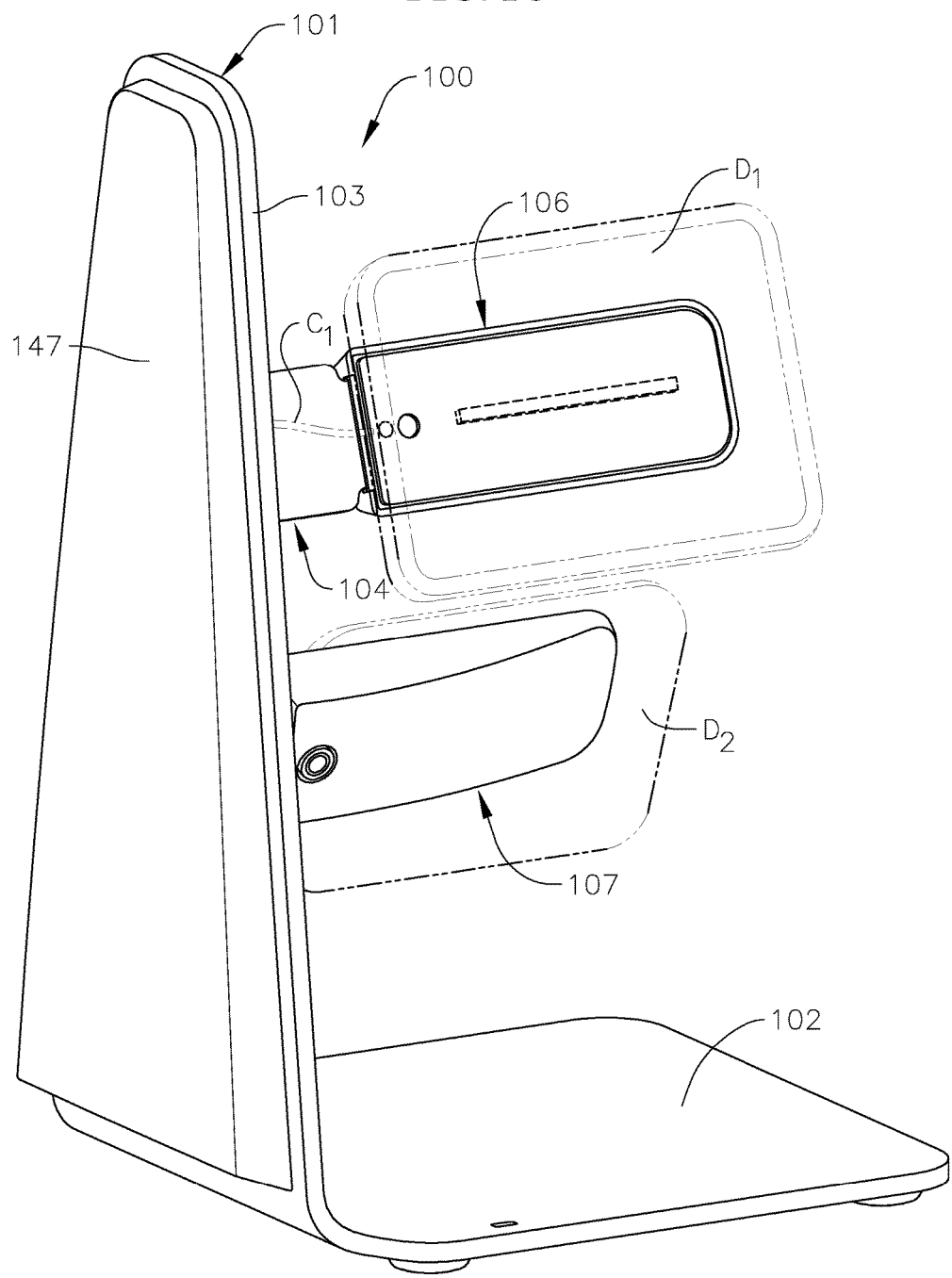

In one or more embodiments, the device attachment members 106, 107 are each configured to support an electronic device $D_1$, $D_2$, respectively (e.g., tablet computers for use as a point-of-sale device), as shown in FIG. 1B. The electronic devices $D_1$, $D_2$ may be secured to the device attachment members 106, 107, respectively, in any suitable manner, such as, for instance, with an adhesive (e.g., very high bond tape, such as 3M VHB™) and/or hook-and-loop type fasteners. Although in the illustrated embodiment the stand assembly 100 includes two support arms 104, 105 and two corresponding device attachment members 106, 107, in one or more embodiments, the stand assembly 100 may include any other number of support arms and a corresponding number of device attachment members depending, for instance, on the number of electronic devices the stand assembly 100 is configured to support (e.g., the stand assembly 100 may include a single support arm and a single device attachment member, or the stand assembly 100 may include more than two pairs of corresponding support arms and device attachment members).

In one or more embodiments in which the stand assembly 100 has two or more device attachment members, the device attachment members may face in different directions. In one or more embodiments, the device attachment members may face in generally opposite directions such that when the electronic devices (e.g., the tablet computers) are supported on the device attachment members, the electronic devices face in generally opposite directions. For instance, in the illustrated embodiment, the upper device attachment member 106 faces in a first direction and the lower device attachment member 107 faces in a second direction different than the first direction. In the illustrated embodiment, the upper support arm 104 and the corresponding upper device attachment member 106 may be oriented generally forward and the lower support arm 105 and the corresponding lower device attachment member 107 may be oriented generally rearward such that the electronic device $D_1$ supported by the upper device attachment member 106 faces generally forward and the electronic device $D_2$ supported by the lower device attachment member 107 faces generally rearward. This configuration may be suitable when the stand assembly 100 is used to support electronic devices in a retail point-of-sale application (e.g., the forward facing tablet computer $D_1$ supported on the upper device attachment member 106 may be used by a customer and the rearward facing tablet computer $D_2$ supported on the lower attachment member 107 may be used by an employer, or vice versa, or the forward and rearward facing tablet computers $D_1$, $D_2$ may be used by two different customers).

With continued reference to the embodiment illustrated in FIGS. 1A-1H, each of the support arms 104, 105 is an L-shaped bracket including a first flange 108 parallel to the support portion 103 of the stand 101 (e.g., a vertical flange) and a second flange 109 substantially perpendicular to the first flange 108 (e.g., a horizontal flange) and extending outward from the first flange 108. The horizontal flange 109 includes an inner end 110 connected to the vertical flange 108 and a free, outer end 111 opposite to the inner end 110.

Additionally, in the illustrated embodiment, the horizontal flange 109 of each of the support arms include a pair of tines 112, 113 (i.e., a pair of insertion portions) spaced apart by a slot or channel 114. The slot 114 extends inward from free, outer end 111 of the horizontal flange 109 along at least a portion of the horizontal flange 109 toward the inner end 110 of the horizontal flange 109. The slot 114 has an open end 115 at the free, outer end 111 of the horizontal flange 109.

In the illustrated embodiment, the vertical flange 108 is shorter than the horizontal flange 109, although in one or more embodiments the vertical and horizontal flanges 108, 109 may have any other suitable relative lengths. Additionally, in the illustrated embodiment, the vertical flange 108 of each of the support arms 104, 105 defines a circular opening 116 (e.g., a circular hole) and a cog 117 (e.g., a stop or a protrusion) extending inward into the circular opening 116. As described in more detail below, the cogs 117 of the support arms 104, 105 are configured to limit the rotation (e.g., the tilt) of support arms 104, 105 relative to the stand 101. Additionally, in the illustrated embodiment, the vertical flange 108 of each of the support arms 104, 105 is wider than the corresponding horizontal flange 109, and a pair of opposing steps 118, 119 (e.g., joggles) are defined between the relatively wider vertical flange 108 and the relatively narrower horizontal flange 109.

In the illustrated embodiment, each of the device attachment members 106, 107 includes a generally flat interface plate 120 and a contoured cover 121 coupled to the interface plate 120. The interface plate 120 of each device attachment member 106, 107 is configured to support an electronic device (e.g., a table computer). In one or more embodiments, the interface plate 120 may include an adhesive (e.g., very high bond tape) for securing the electronic device to the device attachment member 106, 107. Together, the interface plate 120 and the contoured cover 121 of each of the device attachment members 106, 107 define a pair of receptacles 122, 123 (i.e., a pair of receptacles 122, 123 is defined between the interface plate 120 and the contoured cover 121 of each of the device attachment members 106, 107). Additionally, in the illustrated embodiment, each of the device attachment members 106, 107 includes at least one central rib 124 separating or partitioning the pair of receptacles 122, 123. The central rib 124 may be a portion of the interface plate 120 or the contoured cover 121, or the central rib 124 may be provided on a separate component retained between the interface plate 120 and the contoured cover 121. The central rib 124 is configured to provide structural support (e.g., rigidity) to the device attachment members 106, 107. The pair of receptacles 122, 123 in each of the device attachment members 106, 107 is configured to receive (i.e., accommodate) the pair of tines 112, 113 of the corresponding support arm 104, 105, and the slot 114 in each of the support arms 104, 105 is configured to receive (i.e., accommodate) the central rib 124 in the corresponding device attachment member 106, 107. In the illustrated embodiment, the receptacles 122, 123 and the tines 112, 113 have corresponding rectangular cross-sectional shapes (e.g., the shape of tines 112, 113 of the support arms 104, 105 matches or substantially matches the shape of the receptacles 122, 123 defined in the device attachment members 106, 107), although in one or more embodiments, the receptacles 122, 123 and the tines 112, 113 may have any other suitable corresponding cross-sectional shapes.

To connect the support arms 104, 105 to the device attachment members 106, 107, the device attachment members 106, 107 may be slid onto the horizontal flanges 109 of the support arms 104, 105, respectively, such that the pair of tines 112, 113 of each support arm 104, 105 are inserted into the pair of receptacles 122, 123 in the corresponding device attachment member 106, 107. As the tines 112, 113 are inserted into the receptacles 122, 123, the central rib 124 of each device attachment member 106, 107 enters the open end 115 of the slot 114 in the corresponding support arm 104, 105 and slides along the length of the slot 114. The engagement between the central ribs 124 of the device attachment members 106, 107 and the slots 114 in the support arms 104, 105 is configured to guide the device attachment members 106, 107 into the proper orientation with the support arms 104, 105. The engagement between the central ribs 124 and the slots 114 is also configured to maintain the device attachment members 106, 107 in the proper orientation relative to the support arms 104, 105 once the device attachment members 106, 107 have been coupled to the support arms 104, 105.

Additionally, the central ribs 124 are configured to contact innermost ends of the slots 114 once the device attachment members 106, 107 have been slid completely onto the support arms 104, 105 (i.e., the central ribs 124 are configured to contact the innermost ends of the slots 114 once the tines 112, 113 have been fully inserted into the receptacles 122, 123). In this manner, the central ribs 124 and the slots 114 are configured to function as stops preventing further insertion of the tines 112, 113 into the receptacles 122, 123.

Additionally, in the illustrated embodiment, each of the device attachment members 106, 107 defines an attachment opening 125 (e.g., a hole substantially orthogonal to the pair of receptacles 122, 123) and each of the support arms 104, 105 defines a corresponding attachment opening 126 (e.g., a hole). In the illustrated embodiment, the attachment openings 125 are defined in the contoured covers 121 of the device attachment members 106, 107. The attachment openings 125 extend through the contoured covers 121 and into the receptacles 122, 123 (i.e., the attachments openings 125 in the device attachment members 106, 107 are in communication with the receptacles 122, 123 in the device attachment members 106, 107). In the illustrated embodiment, the attachment openings 126 in the support arms 104, 105 are aligned with the slots 114, although in one or more embodiments the attachment openings 126 may be located in any other suitable position in the support arms 104, 105. When the tines 112, 113 of the support arms 104, 105 are fully inserted into the receptacles 122, 123 in the device attachment members 106, 107 (e.g., the central ribs 124 are in contact with the innermost ends of the slots 114), the attachment openings 125 in the device attachment members 106, 107 are aligned with the attachment openings 126 in the support arms 104, 105, respectively. Accordingly, when the tines 112, 113 of the support arms 104, 105 are fully inserted into the receptacles 122, 123 in the device attachment members 106, 107, fasteners 127 (e.g., pin locks) may be inserted through the aligned attachment openings 125, 126 to secure the device attachment members 106, 107 to the support arms 104, 105, respectively.

To detach the device attachment members 106, 107 from the support arms 104, 105, the fasteners 127 (e.g., the pin locks) may be removed from the attachment openings 125, 126 and then the device attachment members 106, 107 may be slid off of the support arms 104, 105 to withdraw the tines 112, 113 of the support arms 104, 105 from the receptacles 122, 123 in the device attachment members 106, 107.

With continued reference to the embodiment illustrated in FIGS. 1A-1H, the stand assembly 100 also includes a pair of caps 128, 129 (e.g., an upper cap 128 and a lower cap 129) configured to movably and adjustably (e.g., rotatably)

couple the support arms 104, 105, respectively, to the support portion 103 of the stand 101. In the illustrated embodiment, the support portion 103 of the stand 101 defines two pairs of openings 130, 131 (i.e., an upper pair of openings 130 and a lower pair of openings 131). These openings 130, 131 define attachment points for the caps 128, 129, respectively. The openings 130, 131 in the support portion 103 of the stand 101 are configured to receive fasteners 132, 133, respectively, fixedly coupling the caps 128, 129, respectively, to the support portion 103 of the stand 101. In the illustrated embodiment, each of the caps 128, 129 is a generally circular member (e.g., a disc). The caps 128, 129 are configured to be installed on the same side of the support portion 103 of the stand 101 as the support arms 104, 105 (e.g., in the illustrated embodiment, the caps 128, 129 and the support arms 104, 105 are configured to engage an inner surface 134 of the support portion 103 of the stand 101).

Additionally, in the illustrated embodiment, each of the caps 128, 129 includes a circular standoff 135 having a flat outer surface 136, and an annular flange 137 offset from the flat outer surface 136 of the circular standoff 135. The annular flange 137 extends radially outward from the circular standoff 135. In the illustrated embodiment, the annular flange 137 is larger than the circular standoff 135 (e.g., the annular flange 137 has a larger diameter than the circular standoff 135). The circular standoffs 135 of the caps 128, 129 are configured to be received in the openings 116 in the vertical flanges 108 in the support arms 104, 105. Additionally, the annular flanges 137 of the caps 128, 129 are larger than the openings 116 in the vertical flanges 108 of the support arms 104, 105 such that the annular flanges 137 of the caps 128, 129 are configured to overlap a portion of the vertical flanges 108 of the support arms 104, 105 when the support arms 104, 105 are coupled to the stand 101 by the caps 128, 129. Additionally, in the illustrated embodiment, the each of the caps 128, 129 includes a pair of openings 138, 139 configured to receive the fasteners 132, 133, respectively, coupling the caps 128, 129 to the stand 101.

To movably (e.g., rotatably) couple the support arms 104, 105 to the stand 101, the circular standoffs 135 of the caps 128, 129 may be inserted into the openings 116 in the vertical flanges 108 of the support arms 104, 105. The fasteners 132, 133 may then be inserted through the openings 130, 131 in the support portion 103 of the stand 101 and into the openings 138, 139 in the caps 128, 129. As described above, the annular flanges 137 of the caps 128, 129 are larger than the openings 116 in the vertical flanges 108 of the support arms 104, 105 such that the annular flanges 137 of the caps 128, 129 overlap a portion of the vertical flanges 108 and thereby retain the support arms 104, 105 attached to the caps 128, 129 (e.g., the annular flanges 137 of the caps 128, 129 are configured to prevent the support arms 104, 105 from inadvertently disengaging the caps 128, 129). When the support arms 104, 105 are coupled to the stand 101 by the caps 128, 129, the circular standoffs 135 are received in the openings 116 in the vertical flanges 108 of the support arms 104, 105, the outer surfaces 136 of the circulate standoffs 135 contact the inner surface 134 of the support portion 103 of the stand 101, and the annular flanges 137 contact the vertical flanges 108 of the support arms 104, 105 such that the vertical flanges 108 of the support arms 104, 105 are retained between the support portion 103 of the stand 101 and the annular flanges 137 of the caps 128, 129.

Figure 1F:
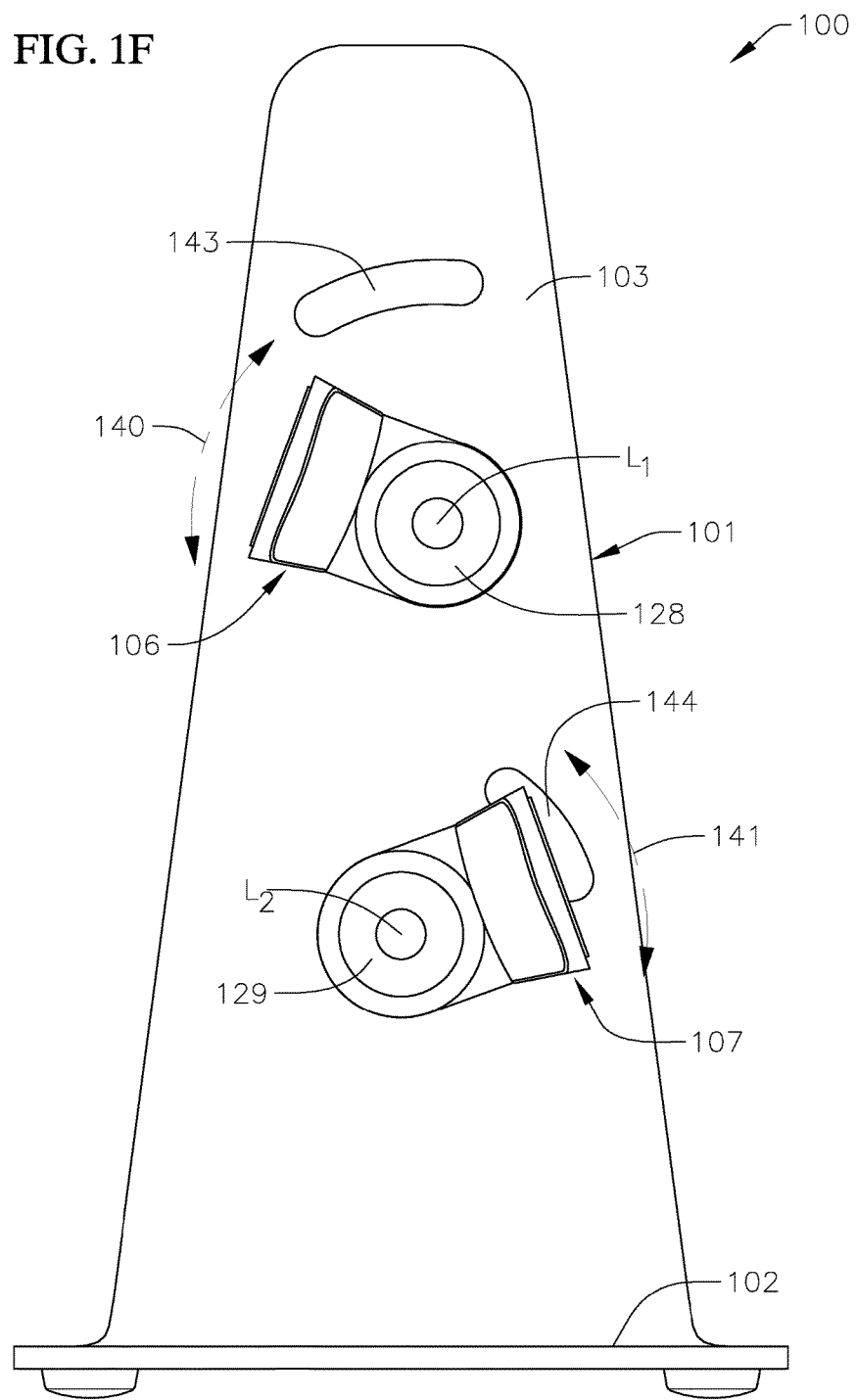
Figure 1G:
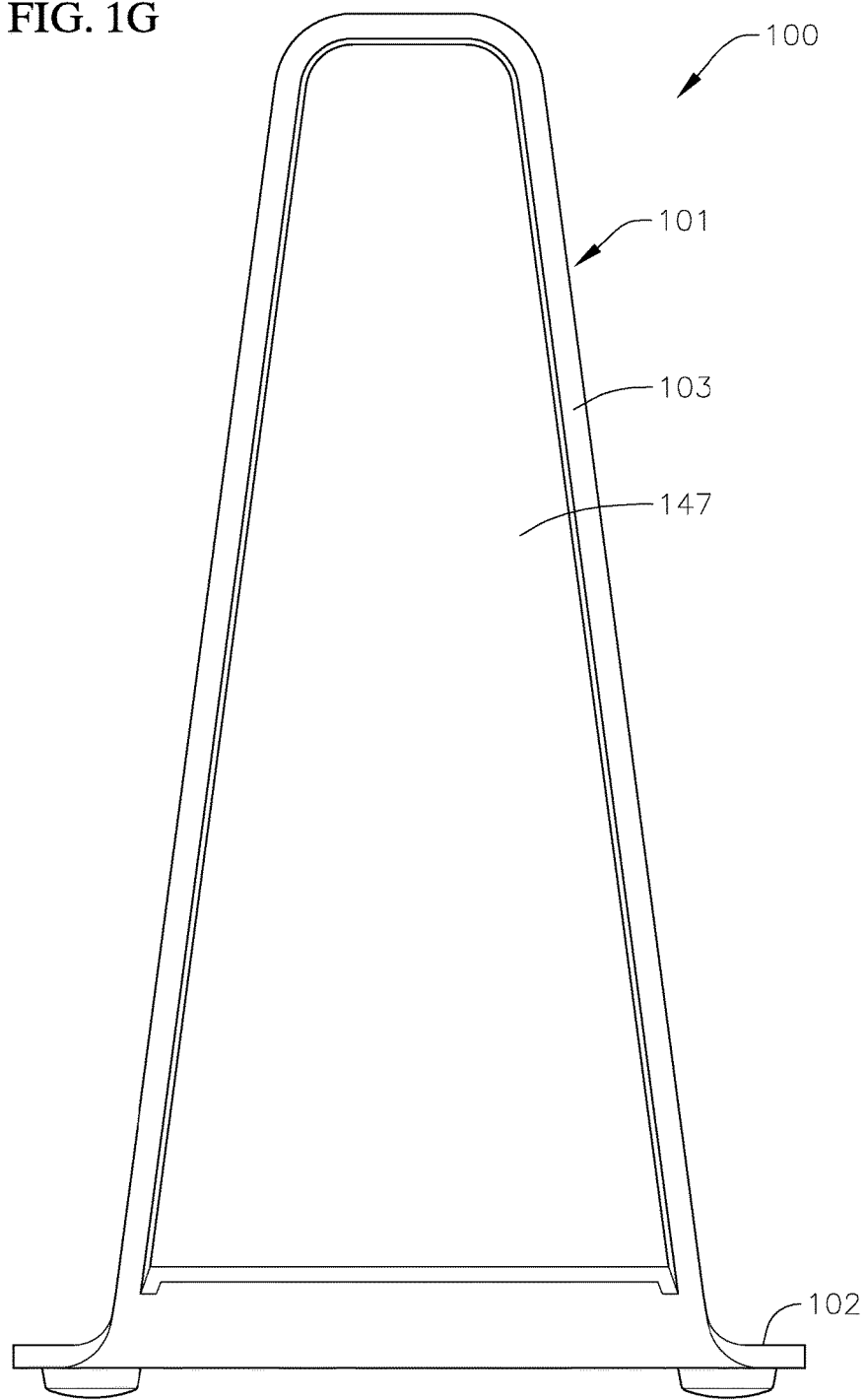
Figure 1H:
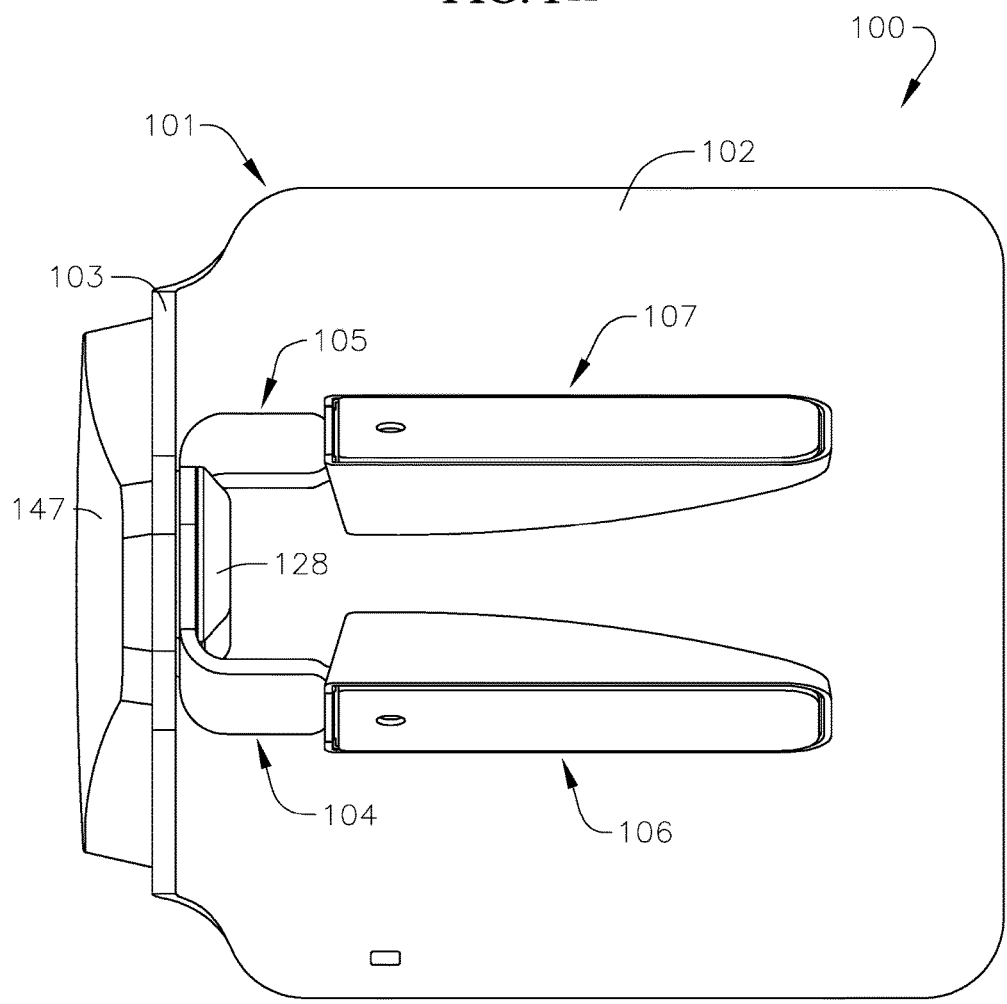

When the support arms 104, 105 are coupled to the stand 101, the engagement between the circular standoffs 135 of the caps 128, 129 and the circular openings 116 in the support arms 104, 105 is configured to permit the support arms 104, 105, and the device attachment members 106, 107 connected thereto, to rotate about a longitudinal axis $L_1$, $L_2$, respectively, of the caps 128, 129, as illustrated in FIG. 1F (e.g., the caps 128, 129 allow the support arms 104, 105 to rotate around the center axes $L_1$, $L_2$ of the caps 128, 129 for adjustment of the interface angle of the electronic devices supported on the device attachment members 106, 107, which are connected to the support arms 104, 105). In the illustrated embodiment, the longitudinal axes $L_1$, $L_2$ of the caps 128, 129 are parallel or substantially parallel to the base portion 102 of the stand 101. When the support arms 104, 105 are coupled to the stand 101, the device attachment members 106, 107 are coupled to the support arms 104, 105, and the electronic devices (e.g., the tablet computers) are connected (e.g., adhered) to the device attachment members 106, 107, the electronic devices (e.g., the tablet computers) are supported at an angular orientation corresponding to the angular orientation into which the support arms 104, 105 have been rotated relative to the stand 101. Accordingly, the angular orientation (e.g., the pitch) of the electronic devices (e.g., the tablet computers) connected to the device attachment members 106, 107 may be adjusted into the desired angular orientation by rotating (arrows 140, 141) the support arms 104, 105 and the device attachment members 106, 107 relative to the stand 101. The angular orientation of the electronic devices may be adjusted depending, for instance, on the desired viewing angle of the electronic devices by the user.

Additionally, in the illustrated embodiment, each of the caps 128, 129 includes a notch 142 in a portion of the circular standoff 135. The notches 142 accommodate the cogs 117 on the corresponding support arm 104, 105 when the support arms 104, 105 are rotatably coupled to the stand 101 by the caps 128, 129. Additionally, in the illustrated embodiment, the notches 142 in the caps 128, 129 are larger (e.g., longer) than the corresponding cogs 117 in the support arms 104, 105. For instance, in one or more embodiments, the cogs 117 are arcuate protrusions and the notches 142 are arcuate notches that extend to a greater angular extent than the arcuate protrusions. The larger size of the notches 142 in the caps 128, 129 is configured to permit the support arms 104, 105 to rotate (arrow 140, 141) relative to the stand 101 and the caps 128, 129, which are fixedly coupled to the caps 128, 129, to a limited extent (e.g., the support arms 104, 105 may be rotated in a first direction until the cogs 117 contact a first end of the notches 142 in the caps 128, 129, and the support arms 104, 105 may be rotated in a second direction opposite to the first direction until the cogs 117 contact a second end of the notches 142 in the caps 128, 129). The size of the notches 142 in the caps 128, 129 relative to the size of the cogs 117 may be selected depending on the desired degree of rotation (e.g., tilt or pitch) of the support arms 104, 105 relative to the stand 101. Although in the illustrated embodiment the sizes of the cogs 117 and the notches 142 is the same in the upper and lower support arms 104, 105 and the upper and lower caps 128, 129 such that the upper and lower support arms 104, 105 are configured to rotate (arrows 140, 141) the same maximum degree relative to the stand 101, in one or more embodiments the relative sizes of the cog 117 and the notch 142 in the upper support arm 104 and the upper cap 128, respectively, may be different than the relative sizes of the cog 117 and the notch 142 in the lower support arm 105 and the lower cap 129, respectively, such that the upper support arm 104 may be configured to rotate to a different degree than the lower support arm 105.

The fasteners 132, 133 may be adjusted to draw and withdraw the support arms 104, 105 into tighter or looser engagement, respectively, with the support portion 103 of the stand 101. Adjusting the fasteners 132, 133 coupling the caps 128, 129 and the support arms 104, 105 to the stand 101 changes the tilt resistance of the support arms 104, 105 and the device attachment members 106, 107 (i.e., the resistance of the support arms 104, 105 and the device attachment members 106, 107 to being rotated (arrows 140, 141) about the longitudinal axes $L_1$, $L_2$). For instance, the fasteners 132, 133 may be loosened (e.g., unscrewed) to reduce the tilt resistance of the support arms 104, 105 and the device attachment members 106, 107 (i.e., loosening the fasteners 132, 133 reduces the frictional force which must be overcome to rotate (arrows 140, 141) the support arms 104, 105, the device attachment members 106, 107, and the devices mounted thereon about the longitudinal axes $L_1$, $L_2$ of the caps 128, 129). Additionally, the fasteners 132, 133 may be tightened to draw the support arms 104, 105 into tighter engagement with the support portion 103 of the stand 101 and thereby increase the tilt resistance of the support arms 104, 105 and the device attachment members (i.e., tightening the fasteners 132, 133 increases the frictional force which must be overcome to rotate (arrows 140, 141) the support arms 104, 105 the device attachment members 106, 107, and the devices mounted thereon about the longitudinal axes $L_1$, $L_2$ of the caps 128, 129).

In the illustrated embodiment, the openings 138, 139 in each of the caps 128, 129 are positioned opposite to each other (i.e., 180 degrees apart). Accordingly, for each cap 128, 129, the fasteners 132, 133 fixedly coupling the caps 128, 129 to the support portion 103 of the stand 101 are positioned opposite to each other (i.e., 180 degrees apart). The orientation of the fasteners 132, 133 and the openings 138, 139 in the caps 128, 129 is configured to prevent the caps 128, 129 from rotating relative to the support portion 103 of the stand 101, which could otherwise cause the caps 128, 129 to disengage the fasteners 132, 133 (e.g., rotation of the caps 128, 129, such as during rotation (arrows 140, 141) of the support arms 104, 105 and the device attachment members 106, 107 to adjust the tilt angle of the electronic devices supported on the device attachment members 106, 107, could cause the fasteners 132, 133 to unscrew and thereby disengage the caps 128, 129).

In the illustrated embodiment, the stand assembly 100 is also configured to facilitate unobtrusive and secure routing of the one or more cables $C_1$, $C_2$ (see FIGS. 1D-1E) connected to the electronic devices $D_1$, $D_2$ (e.g., the tablet computers) supported on the device attachment members 106, 107. In the illustrated embodiment, the support portion 103 of the stand 101 defines a pair of cable routing openings 143, 144. In the illustrated embodiment, the pair of cable of cable routing openings 143, 144 includes an upper routing opening 143 located above the upper openings 130 (i.e., the upper attachment points) for the upper cap 128, and a lower routing opening 144 located generally above the lower openings 131 (i.e., the lower attachment points) for the lower cap 129 and below the upper openings 130 (i.e., the lower routing opening 144 is generally between the upper and lower openings 130, 131 that are configured to be utilized as attachment points for the caps 128, 129). The upper routing opening 143 is configured to accommodate one or more cables $C_1$ connected to the electronic device $D_1$ (e.g., the table computer) supported on the upper device attachment member 106, and the lower routing opening 144 is configured to accommodate one or more cables $C_2$ connected to the electronic device $D_2$ (e.g., the table computer) supported on the lower device attachment member 107. In one or more embodiments, the stand 101 may define any other suitable number of cable routing openings. In one or more embodiments, the number of cable routing openings may correspond to the number of support arms 104, 105 and corresponding device attachment members 106, 107, although in one or more embodiments the number of cable routing openings may differ from the number of support arms 104, 105 and corresponding device attachment members 106, 107. Accordingly, when the electronic devices $D_1$, $D_2$ are attached to the device attachment members 106, 107 of the stand assembly 100, the cables $C_1$, $C_2$ from the electronic devices $D_1$, $D_2$ may be routed through the cable routing openings 143, 144, respectively, in the support portion 103 of the stand 101.

Additionally, in the illustrated embodiment, the cable routing openings 143, 144 are curved (e.g., arcuate) openings. In the illustrated embodiment, each of the cable routing openings 143, 144 extends to an angular extent or degree corresponding to the maximum angular rotation (e.g., maximum pitch adjustment) (arrows 140, 141) of the support arms 104, 105. Although in the illustrated embodiment the angular extent of the arcuate cable routing openings 143, 144 is the same or substantially the same as the maximum angular rotation (arrows 140, 141) of the support arms 104, 105 (e.g., the arcuate extent of the arcuate cable routing openings 143, 144 is approximately 25 degrees and the maximum angular rotation of the support arms 104, 105 is approximately 25 degrees), in one or more embodiments, the angular extent of the arcuate cable routing openings 143, 144 may differ from the maximum angular rotation of the support arms 104, 105 (e.g., the angular extent of the cable routing openings 143, 144 may be less than or greater than the maximum angular rotation of the support arms 104, 105). The angular extent of the cable routing openings 143, 144 is configured to permit the cables $C_1$, $C_2$ connected to the electronic devices $D_1$, $D_2$ to slide within the cable routing openings 143, 144 as the support arms 104, 105 are rotated (arrows 140, 141) to adjust the pitch of the support arms 104, 105 and the device attachment members 106, 107 connected thereto. Otherwise, contact between the cables $C_1$, $C_2$ connected to the electronic devices $D_1$, $D_2$ and the cable routing openings 143, 144 could prematurely wear the cables $C_1$, $C_2$ (e.g., fray the cables) and/or snag the cables $C_1$, $C_2$, which could cause the cables $C_1$, $C_2$ to disconnect from the electronic devices $D_1$, $D_2$ supported by the device attachment members 106, 107.

Additionally, in the illustrated embodiment, the stand assembly 100 also includes a pair of bushings 145, 146 (see FIGS. 1A-1B) on opposite sides of the vertical flange 108 of each of the support arms 104, 105. The bushings 145, 146 are configured to minimize or at least reduce wear on the stand 101, the support arms 104, 105, and the caps 128, 129, which might otherwise occur due to rotation (arrows 140, 141) of the support arms 104, 105 relative to the stand 101 and the caps 128, 129.

Additionally, in the illustrated embodiment, the stand assembly 100 includes a cover 147 configured to be detachably connected to an outer surface 148 of the support portion 103 of the stand 101. The cover 147 is configured to conceal the fasteners 132, 133 fixedly coupling the caps 128, 129 to the stand 101 and the cable routing openings 143, 144 in the support portion 103 of the stand 101. The cover 147 is also configured to conceal the cables $C_1$, $C_2$ (e.g., the power cables) connected to the electronic devices $D_1$, $D_2$ supported by the device attachment members 106, 107. The cover 147 is also configured to route the cables $C_1$, $C_2$ down toward the base 102 of the stand 101. In the illustrated embodiment, a lower end of the cover 147 includes an opening 149 configured to permit the cables $C_1$, $C_2$ to extend out from the cover 147 and be routed away from the stand 101 (e.g., to a power supply). In the illustrated embodiment, the cover 147 matches or substantially matches the size and shape of the support portion 103 of the stand 101, although in one or more embodiments, the size and/or shape of the cover 147 may not match the size and/or shape of the support portion 103 of the stand 101.

In the illustrated embodiment, the stand assembly 100 also includes a pair of brackets 150, 151 configured to detachably attach the cover 147 to the support portion 103 of the stand 101. The brackets 150, 151 are coupled to the outer surface 148 of the support portion 103 of the stand 101. In the illustrated embodiment, the pair of brackets 150, 151 includes an upper bracket 150 (e.g., a hook or a latch) oriented horizontally and a lower bracket 151 oriented vertically. In the illustrated embodiment, the fasteners 133 fixedly coupling the lower cap 129 to the stand 101 also secure the lower bracket 151 to the support portion 103 of the stand 101, although in one or more embodiments separate fasteners or any other suitable fastening mechanism may be utilized to secure the lower bracket 151 to the support portion 103 of the stand 101. Additionally, in the illustrated embodiment, the cover 147 includes an upper recess 152 (e.g., a groove or a slot defined by a catch) configured to receive at least a portion of the upper bracket 150, and a lower vertical rib 153 configured to extend into a channel 154 defined between a pair of ribs 155 in the lower vertical bracket 151.

To detachably couple the cover 147 to the outer surface 148 of the support portion 103 of the stand 101, the upper end of the cover 147 may be advanced toward the support portion 103 of the stand 101 until the upper bracket 150 extends into the upper recess 152 in the cover 147. The lower end of the cover 147 may then be rotated toward the support portion 103 of the stand 101 until the lower vertical rib 153 on the cover 147 extends into the channel 154 in the lower vertical bracket 151 on the support portion 103 of the stand 101. In one or more embodiments, the vertical rib 153 on the cover 147 and the channel 154 in the lower vertical bracket 151 may be configured (e.g., sized) such that the vertical rib 153 is coupled to the channel 154 with a press fit or friction fit. The engagement between the upper recess 152 in the cover 147 and the upper horizontal bracket 150, and between the vertical rib 153 on the cover 147 and the lower vertical bracket 151, detachably couples the cover 147 to the support portion 103 of the stand 101. The horizontally oriented upper bracket 150 is configured to set the vertical position of the cover 147 on the support portion 103 of the stand 101 and the vertically oriented lower bracket 151 is configured to set the horizontal or lateral position of the cover 147 on the support portion 103 of the stand 101.

To detach the cover 147 from the support portion 103 of the stand 101, the lower end of the cover 147 may be pulled away from the support portion 103 of the stand 101 until the vertical rib 153 on the cover 147 separates from the channel 154 of the lower vertical bracket 151, and then the cover 147 may be lifted up until the upper bracket 150 is withdrawn from the upper recess 152 in the cover 147. In one or more embodiments, the cover 147 may be detachably coupled to the stand 101 in any other suitable manner and by any other suitable mechanism or mechanisms.

With continued reference to the embodiment illustrated in FIGS. 1A-1B, the base portion 102 of the stand 101 defines an opening 157 (e.g., a square-shaped opening) configured to receive a key lock. The key lock may be utilized to secure the stand 101 to a fixture, such as a table, to prevent or at least deter theft. In one or more embodiments, the stand assembly 100 may include any other suitable mechanism or mechanisms instead of, or in addition to, the key lock opening 157 for securing the stand 101 to a fixture (e.g., a lower surface of the base portion 102 of the stand 101 may be provided with a high strength adhesive for bonding the stand 101 to the fixture).

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. One or more of the features described with reference to one embodiment may be combined with one or more other features described with reference to one or more other embodiments to provide a workable device. Although relative terms such as "forward," backward," "outer," "inner," "upper," "lower," and similar terms have been used herein to describe a spatial relationship of one element to another, it is understood that these terms are intended to encompass different orientations of the various elements and components of the invention in addition to the orientation depicted in the FIGURES. Additionally, as used herein, the term "substantially" and similar terms are used as terms of approximation and not as terms of degree, and are intended to account for the inherent deviations in measured or calculated values that would be recognized by those of ordinary skill in the art. Furthermore, as used herein, when a component is referred to as being "on" or "coupled to" another component, it can be directly on or attached to the other component or intervening components may be present therebetween. Further, any described feature is optional and may be used in combination with one or more other features to achieve one or more benefits.

What is claimed is:

1. A stand assembly, comprising:
   a stand having a base portion and a support portion extending from the base portion, the support portion defining at least one cable routing opening;
   at least one support arm configured to be coupled to the support portion of the stand; and
   at least one device attachment member configured to be detachably coupled to the at least one support arm,
   wherein the at least one support arm is configured to rotate relative to the support portion of the stand between a first angular position and a second angular position, and
   wherein the at least one cable routing opening is an arcuate opening extending about an angle corresponding to an angle between the first angular position and the second angular position.

2. The stand of claim 1, further comprising:
   at least one cap configured to rotatably couple the at least one support arm to the support portion of the stand; and
   at least one fastener configured to couple the at least one cap to the support portion of the stand,
   wherein tightening of the at least one fastener is configured to draw the at least one support arm into tighter engagement with the support portion of the stand to increase a tilt resistance of the at least one support arm, and wherein loosening of the at least one fastener is configured to withdraw the at least one support arm into looser engagement with the support portion of the stand to reduce the tilt resistance of the at least one support arm.

3. The stand assembly of claim 2, wherein:
the at least one cap comprises a circular standoff,
the at least one support arm comprises a circular opening configured to accommodate the circular standoff, and
engagement between the circular standoff and the circular opening permits the at least one support arm to rotate relative to the at least one cap.

4. The stand assembly of claim 3, wherein:
the at least one support arm further comprises a cog extending into the circular opening,
the at least one cap comprises a notch in the circular standoff configured to accommodate the cog, and
engagement between the cog and an end of the notch is configured to limit the rotation of the at least one support arm.

5. The stand assembly of claim 4, wherein the at least one cap further comprises an annular flange extending radially outward from the circular standoff, and wherein the annular flange is larger than the circular opening in the at least one support arm.

6. The stand assembly of claim 1, wherein the at least one support arm comprises a pair of tines separated by a slot.

7. The stand assembly of claim 6, wherein the at least one device attachment member defines a pair of receptacle portions separated by a central rib, and wherein the pair of tines is received in the pair of receptacle portions and the rib is received in the slot when the at least one device attachment member is coupled to the at least one support arm.

8. The stand assembly of claim 7, further comprising:
an attachment opening defined in the at least one device attachment member;
an attachment opening defined in the at least one support arm, wherein the attachment opening in the at least one support arm is aligned with the attachment opening in the at least one device attachment member when the pair of tines of the at least one support arm is received in the pair of receptacles in the at least one device attachment member; and
a pin lock configured to extend through the attachment opening in the at least one device attachment member and into the attachment opening in the at least one support arm to secure the at least one device attachment member to the at least one support arm.

9. The stand assembly of claim 1, further comprising a cover configured to be coupled to the support portion of the stand, and wherein when the cover installed, the cover conceals the at least one cable routing opening.

10. The stand assembly of claim 1, wherein:
the at least one cable routing opening comprises a first cable routing opening and a second cable routing opening,
the at least one support arm comprises a first support arm configured to be coupled to the support portion of the stand proximate to the first cable routing opening and a second support arm configured to be coupled to the support portion of the stand proximate to the second cable routing opening, and
the at least one device attachment member comprises a first device attachment member configured to be coupled to the first support arm and a second device attachment member configured to be coupled to the second support arm.

11. The stand assembly of claim 10, wherein when the first and second support arms are coupled to the stand and the first and second device attachment members are coupled to the first and second support arms, the first device attachment member faces in a first direction and the second device attachment member faces in a second direction different than the first direction.

12. A system, comprising:
at least one electronic device; and
a stand assembly supporting the at least on electronic device, the stand assembly comprising:
a stand having a base portion and a support portion extending from the base portion, the support portion defining at least one cable routing opening;
at least one support arm rotatably coupled to the support portion of the stand, the at least one support arm comprises a circular opening and a cog extending into the circular opening;
at least one device attachment member detachably coupled to the at least one support arm,
at least one cap rotatably coupling the at least one support arm to the support portion of the stand, the at least one cap comprises a circular standoff and a notch defined in the circular standoff; and
at least one fastener fixedly coupling the at least one cap to the support portion of the stand,
wherein the at least one support arm is configured to rotate relative to the support portion of the stand between a first angular position and a second angular position,
wherein the circular standoff is received in the circular opening and engagement between the circular standoff and the circular opening permits the at least one support arm to rotate relative to the at least one cap, and
wherein the cog extends into the notch and engagement between the cog and an end of the notch limits rotation of the at least one support arm.

13. The system of claim 12, wherein the at least one cable routing opening is an arcuate opening extending about an angle corresponding to an angle between the first angular position and the second angular position.

14. The system of claim 12,
wherein tightening of the at least one fastener draws the at least one support arm into tighter engagement with the support portion of the stand to increase a tilt resistance of the at least one support arm, and
wherein loosening of the at least one fastener withdraws the at least one support arm into looser engagement with the support portion of the stand to reduce the tilt resistance of the at least one support arm.

15. The system of claim 12, wherein the at least one cap further comprises an annular flange extending radially outward from the circular standoff, and wherein the annular flange is larger than the circular opening in the at least one support arm to retain the at least one support arm rotatably connected to the at least one cap.

16. The system of claim 12, wherein:
the at least one support arm comprises a pair of tines separated by a slot,
the at least one device attachment member defines a pair of receptacle portions separated by a central rib, and
the pair of tines is received in the pair of receptacle portions and the rib is received in the slot.

17. The system of claim 12, further comprising a cover detachably coupled to support portion of the stand, the cover concealing the at least one cable routing opening.

18. The system of claim 12, wherein:
the at least one cable routing opening comprises a first cable routing opening and a second cable routing opening,
the at least one support arm comprises a first support arm coupled to the support portion of the stand proximate to the first cable routing opening and a second support arm coupled to the support portion of the stand proximate to the second cable routing opening,
the at least one device attachment member comprises a first device attachment member coupled to the first support arm and a second device attachment member coupled to the second support arm, and
the first device attachment member faces in a first direction and the second device attachment member faces in a second direction different than the first direction.

19. The system of claim 12, further comprising:
an attachment opening defined in the at least one device attachment member;
an attachment opening defined in the at least one support arm, wherein the attachment opening in the at least one support arm is aligned with the attachment opening in the at least one device attachment member; and
a pin lock extending through the attachment opening in the at least one device attachment member and into the attachment opening in the at least one support arm to secure the at least one device attachment member to the at least one support arm.

20. A stand assembly, comprising:
a stand having a base portion and a support portion extending from the base portion, the support portion defining a pair of cable routing openings;
a pair of first and second support arms configured to be coupled to the support portion of the stand, each of the first and second support arms comprising a pair of tines separated by a slot, a circular opening, and a cog extending into the circular opening;
a pair of first and second device attachment members configured to be detachably coupled to the pair of first and second support arms, each of the first and second device attachment members comprising a pair of receptacle portions separated by a central rib;
a pair of first and second caps configured to rotatably couple the pair of first and second support arms to the support portion of the stand, each of the first and second caps comprising a circular standoff and a notch in the circular standoff; and
a cover configured to be coupled to the support portion of the stand,
wherein, for each support arm and corresponding cap, engagement between the circular standoff and the circular opening permits the support arm to rotate relative to the support portion of the stand between a first angular position and a second angular position,
wherein, for each support arm and corresponding cap, engagement between the cog and an end of the notch limits rotation of the support arm,
wherein each cable routing opening of the pair of cable routing openings is an arcuate opening extending about an angle corresponding to an angle between the first angular position and the second angular position,
wherein, for each support arm and corresponding device attachment member, the pair of tines is received in the pair of receptacle portions and the rib is received in the slot when the pair of first and second device attachment members is coupled to the pair of first and second support arms.

\* \* \* \* \*